US012772863B2

(12) United States Patent
Meyer et al.

(10) Patent No.: US 12,772,863 B2
(45) Date of Patent: Oct. 20, 2026

(54) LEADED SEMICONDUCTOR PACKAGE FORMATION USING LEAD FRAME WITH STRUCTURED CENTRAL PAD

(71) Applicant: Infineon Technologies AG, Neubiberg (DE)

(72) Inventors: Thorsten Meyer, Regensburg (DE); Fee Hoon Wendy Wong, Melaka (MY); Thomas Behrens, Wenzenbach (DE); Eric Lopez Bonifacio, Melaka (MY); Chau Fatt Chiang, Melaka (MY); Irmgard Escher-Poeppel, Duggendorf (DE); Giovanni Ragasa Garbin, Malacca (MY); Martin Gruber, Schwandorf (DE); Tien Shyang Law, Schwandorf (MY); Mohamad Azian Mohamed Azizi, Malacca (MY); Si Hao Vincent Yeo, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 1353 days.

(21) Appl. No.: 17/543,199

(22) Filed: Dec. 6, 2021

(65) Prior Publication Data

US 2023/0178428 A1 Jun. 8, 2023

(51) Int. Cl.
*H10W 70/04* (2026.01)
*H10W 90/00* (2026.01)
(Continued)

(52) U.S. Cl.
CPC ........ *H10W 70/042* (2026.01); *H10W 90/811* (2026.01); *H10W 70/481* (2026.01); *H10W 74/111* (2026.01)

(58) Field of Classification Search
CPC . H01L 21/4828; H01L 21/4832; H01L 21/56; H01L 21/561; H01L 21/565;
(Continued)

(56) References Cited

U.S. PATENT DOCUMENTS 6,563,209 B1 5/2003 Takahashi
9,269,595 B2 2/2016 Chi et al.
(Continued)

FOREIGN PATENT DOCUMENTS

DE 102021113069 A1 11/2021
DE 102020108851 B4 3/2023

OTHER PUBLICATIONS

Chiang, Chau Fatt, "Semiconductor Package with Lead Tip Inspection Feature", U.S. Appl. No. 16/882,008, filed May 22, 2020, 1-29.
(Continued)

*Primary Examiner* — Yu Chen
(74) *Attorney, Agent, or Firm* — Murphy, Bilak & Homiller, PLLC

(57) ABSTRACT

A method includes providing a lead frame with a central metal plate and a plurality of leads extending away from the central metal plate, the central metal plate including an upper surface that includes a first mesa that is elevated from recessed regions, mounting a semiconductor die on the upper surface of central metal plate such that a lower surface of the semiconductor die is at least partially disposed on the first mesa, forming electrical interconnections between terminals of the semiconductor die and the leads, forming an encapsulant body on the central metal plate such that the semiconductor die is encapsulated by the encapsulant body and such that the leads protrude out from edge sides of the encapsulant body, and thinning the central metal plate from a rear surface of the central metal plate so as to isolate the first mesa at a lower surface of the encapsulant body.

18 Claims, 13 Drawing Sheets

(51) Int. Cl.
*H10W 70/40* (2026.01)
*H10W 74/10* (2026.01)

(58) Field of Classification Search
CPC ......... H01L 23/49575; H01L 23/49503; H01L 23/4951; H01L 23/31–315; H01L 23/49555; H10W 70/042; H10W 70/048; H10W 70/465; H10W 70/481; H10W 70/411; H10W 70/415; H10W 70/421; H10W 70/424; H10W 90/811; H10W 74/016; H10W 74/111
See application file for complete search history.

(56) References Cited

U.S. PATENT DOCUMENTS

| | | | |
|---|---|---|---|
| 9,401,331 B2 | 7/2016 | Lin et al. | |
| 2002/0041012 A1* | 4/2002 | Sakamoto | H01L 23/4334 257/E23.092 |
| 2008/0211068 A1* | 9/2008 | Chen | H01L 24/14 257/E23.036 |
| 2009/0236135 A1 | 9/2009 | Ueda et al. | |
| 2009/0283884 A1* | 11/2009 | Kang | H01L 24/83 257/676 |
| 2010/0144101 A1 | 6/2010 | Chow et al. | |
| 2010/0244216 A1 | 9/2010 | Huang et al. | |
| 2012/0086117 A1 | 4/2012 | Chang et al. | |
| 2014/0070329 A1 | 3/2014 | Flores et al. | |
| 2014/0124928 A1 | 5/2014 | Lin et al. | |
| 2015/0187695 A1 | 7/2015 | Yu et al. | |
| 2015/0279778 A1 | 10/2015 | Camacho et al. | |
| 2016/0099201 A1 | 4/2016 | Choi et al. | |
| 2017/0033036 A1 | 2/2017 | Kajihara et al. | |
| 2017/0229436 A1 | 8/2017 | Yu et al. | |
| 2017/0256509 A1 | 9/2017 | Lee et al. | |
| 2018/0053713 A1* | 2/2018 | Fontana | H10W 40/778 |
| 2018/0151521 A1 | 5/2018 | Lee et al. | |
| 2019/0110361 A1 | 4/2019 | Abe et al. | |
| 2020/0111765 A1 | 4/2020 | Kim et al. | |
| 2020/0185293 A1 | 6/2020 | Schmalzl et al. | |
| 2020/0211934 A1 | 7/2020 | Ko | |
| 2020/0350222 A1 | 11/2020 | Danny Koh et al. | |
| 2020/0381380 A1 | 12/2020 | Lee et al. | |

OTHER PUBLICATIONS

Chiang, Chau Fatt, "Semiconductor Package With Metal Posts From Structured Leadframe", U.S. Appl. No. 17/536,538, filed Nov. 29, 2021, 1-54.

Saw, Khay Chwan, et al., "Chip to Chip Interconnect in Encapsulant of Molded Semiconductor Package", U.S. Appl. No. 17/412,787, filed Aug. 26, 2021, 1-25.

* cited by examiner

LEADED SEMICONDUCTOR PACKAGE FORMATION USING LEAD FRAME WITH STRUCTURED CENTRAL PAD

TECHNICAL FIELD

The instant application relates to semiconductor devices, and in particular relates to methods of forming semiconductor packages and corresponding semiconductor packages.

BACKGROUND

System Integration is a major development target of the semiconductor industry. In power device applications, there is a need to integrate multiple different devices in a single semiconductor package. For example, an integrated semiconductor package for power applications may include multiple power device dies along with one or more logic dies. This arrangement requires multiple isolated die pads in a single semiconductor package. This can create numerous design challenges. For example, in a lead frame packaging technique, the lead frame may not have sufficient mechanical stability to accommodate multiple die pads and/or the semiconductor dies mounted thereon. Moreover, multi-die packages require a high number of electrical connections, which may be difficult or impossible to effectuate within a desirably small package footprint. Moreover, in power applications, spacing requirements such as creepage and clearance requirements that dictate minimum distances between conductors of different potential, place constraints on the minimum achievable package size.

Thus, there is a need for improved integrated power semiconductor device packages and corresponding methods of manufacture.

SUMMARY

A method of forming a semiconductor package is disclosed. According to an embodiment, the method comprises providing a lead frame with a central metal plate and a plurality of leads extending away from the central metal plate, the central metal plate comprising an upper surface that is structured to comprise a first mesa that is elevated from recessed regions of the central metal plate, mounting a semiconductor die on the upper surface of central metal plate such that a lower surface of the semiconductor die is at least partially disposed on the first mesa, forming electrical interconnections between terminals of the semiconductor die and the leads, forming an encapsulant body of electrically insulating mold compound on the central metal plate such that the semiconductor die is encapsulated by the encapsulant body and such that the leads protrude out from edge sides of the encapsulant body, and thinning the central metal plate from a rear surface of the central metal plate so as to isolate the first mesa at a lower surface of the encapsulant body.

Separately or in combination, the central metal plate comprises a base section of substantially uniform thickness, wherein the first mesa projects upwards from the base section, and wherein thinning the central metal plate comprises removing the base section.

Separately or in combination, a rear surface of the base section is exposed at the lower surface of the encapsulant body before or during the thinning of the central metal plate, and wherein removing the base section comprises processing a rear side of the semiconductor package comprising the lower surface of the encapsulant body and the central metal plate until the base section is completely removed.

Separately or in combination, processing the rear side of the semiconductor package comprises planarizing the rear side of the semiconductor so as to remove material from the encapsulant body and the base section simultaneously, and wherein after the planarizing the lower surface of the encapsulant body is coplanar with an exposed rear surface of the first mesa.

Separately or in combination, processing the rear side of the semiconductor package comprises etching at the exposed rear surface of the base section until the base section is removed.

Separately or in combination, the upper surface of the central metal plate is structured to comprise a second mesa that is elevated from recessed regions of the central metal plate and laterally spaced apart from the first mesa, and wherein thinning the central metal plate isolates the first and second mesas from one another at the lower surface of the encapsulant body.

Separately or in combination, the first mesa is configured as a die pad, and wherein the semiconductor die mounted on the first mesa such that the lower surface of the semiconductor die is at completely disposed on the first mesa.

Separately or in combination, the second mesa is configured as a die pad, wherein the method further comprises mounting a second semiconductor die on the upper surface of central metal plate such that a lower surface of the second semiconductor die is at least partially disposed on the second mesa.

Separately or in combination, the second mesa is configured as a conductive track, and wherein forming the electrical interconnections between terminals of the semiconductor die and the lead frame comprises electrically connecting one of the terminals of the semiconductor die to the second mesa by an electrical interconnect element.

Separately or in combination, the lead frame further comprises a peripheral structure that is connected to the central metal plate by a tie bar, wherein the upper surface of the central metal plate is structured to comprise a tie bar attachment mesa that is elevated from recessed regions of the central metal plate, wherein the tie bar is connected to the tie bar attachment mesa, wherein thinning the central metal plate from the rear surface isolates the first mesa from the tie bar attachment mesa.

Separately or in combination, the method further comprises forming the electrical interconnections comprises providing electrical interconnect elements between the terminals of the semiconductor die and the leads before forming the encapsulant body.

Separately or in combination, the method further comprises providing electrical interconnect elements between the terminals of the semiconductor die and the peripheral structure before forming the encapsulant body.

According to another embodiment, the method comprises providing a lead frame that comprises a central metal plate and a plurality of leads that extend away from outer edge sides of the metal plate, the central metal plate comprising an upper surface that is structured to comprise a plurality of lead extensions that are elevated from recessed regions of the central metal plate and are routed to the leads, mounting a semiconductor die on the upper surface of the central metal plate, electrically connecting terminals of the semiconductor die to the lead extensions, forming an encapsulant body of electrically insulating mold compound on the central metal plate that encapsulates the semiconductor die and exposes outer ends of the leads, and thinning the central metal plate from a rear surface of the central metal plate that is opposite from the upper surface so as to isolate the lead extensions from one another at a lower surface of the encapsulant body.

Separately or in combination, the method further comprises after thinning the central metal plate, providing a layer of electrically insulating material at the lower surface of the encapsulant body that covers the lead extensions.

Separately or in combination, the semiconductor die is mounted on the plurality of lead extensions, and wherein electrically connecting terminals of the semiconductor die comprises flip-chip mounting the semiconductor die such that the terminals of the semiconductor die face and electrically connect with the lead extensions.

Separately or in combination, the central metal plate is structured to comprise a first mesa that is elevated from the recessed regions of the central metal plate, wherein the semiconductor die is mounted on the first mesa, and wherein electrically connecting the terminals of the semiconductor die to the lead extensions comprises providing electrical interconnect elements between the terminals of the semiconductor die and the lead extensions.

Separately or in combination, the lead frame is provided from a lead frame strip that is used to form a plurality of the semiconductor packages, wherein the central metal plate is part of a continuous structure that is used to form each of the semiconductor packages, wherein forming the encapsulant body comprises a molding process that forms the encapsulant material on the continuous structure, and wherein the method further comprises dicing the continuous structure with the encapsulant to singulate the semiconductor package.

Separately or in combination, forming the encapsulant body comprises a molding process that forms the encapsulant material on the central metal plate such that encapsulant material of the encapsulant body surrounds the central metal plate.

Separately or in combination, the upper surface that is structured to comprise an interconnect track that is elevated from the recessed regions of the central metal plate, wherein the method further comprises mounting a second semiconductor die on the upper surface of the central metal plate, electrically connecting one of the terminals of the semiconductor die to the interconnect track, electrically connecting a terminal of the second semiconductor die to the interconnect track.

Separately or in combination, the central metal plate is structured to comprise first and second mesas that are each elevated from the recessed regions of the central metal plate, wherein the semiconductor die is mounted on the first mesa, wherein the second semiconductor die is mounted on the second mesa, wherein electrically connecting one of the terminals of the semiconductor die to the interconnect track comprises providing a first electrical interconnect element between the one of the terminals of the semiconductor die and the interconnect track, and wherein electrically connecting the terminal of the second semiconductor die to the interconnect track comprises providing a second electrical interconnect element between the terminal of the second semiconductor die and the interconnect track.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes

FIG. 2, which includes

FIG. 3, which includes

DETAILED DESCRIPTION

Various embodiments of a method of forming a semiconductor package and a corresponding semiconductor package are described herein. According to the method, a lead frame that comprises a central metal plate and a plurality of package leads is provided. An upper surface of the central metal plate is structured to comprise mesas that are elevated from adjacent recessed regions of the central metal plate. For example, the central metal plate can be structured by a half-etching technique, where the mesas correspond to the non-etched regions and the recess which define the mesas correspond to the half-etched regions. The mesas can be used in a variety of different ways. For example, the mesas can be configured as die pad structures that accommodate the mounting of one or more semiconductor dies thereon. Separately or in combination, the mesas can be configured as conductive tracks that are used to provide electrical connections between the semiconductor dies and package leads and/or between two semiconductor dies. In either case, the central metal plate serves as a temporary carrier structure that accommodates the semiconductor dies and associated electrical interconnect elements during assembly. Because the semiconductor dies and associated electrical interconnect elements are each mounted on a single rigid metal structure, a large number of semiconductor elements can be provided in a single package. Moreover, the provision of conductive tracks can alleviate congestion with other electrical interconnect elements, such as bond wires, clips, ribbons, etc. Once the encapsulant body is formed, the central metal plate can be thinned from its rear side until each of the mesas are released from one another and form electrically isolated islands in the encapsulant material. In this way, an integrated semiconductor package with multiple different types of devices may be obtained with a small package footprint.

Figure 1B:
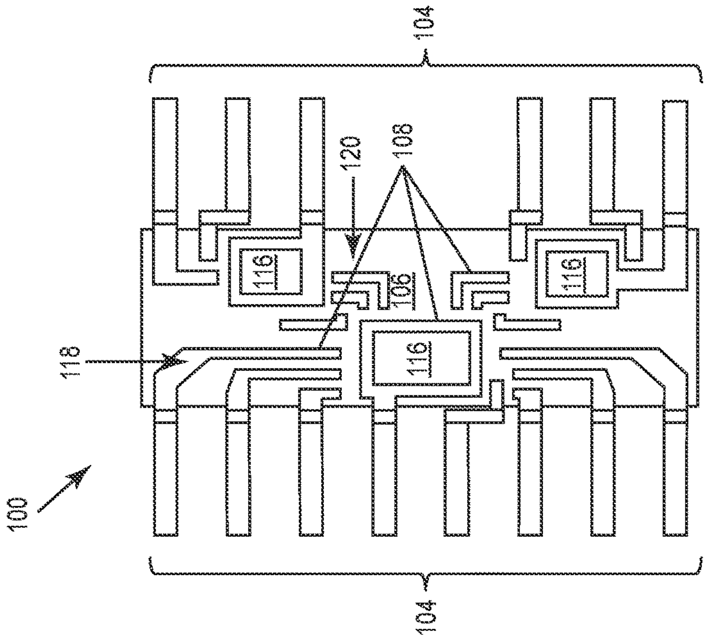
FIGS. 1A-1K, illustrates selected method steps from a method of forming a semiconductor package, according to an embodiment.
Figure 1A:
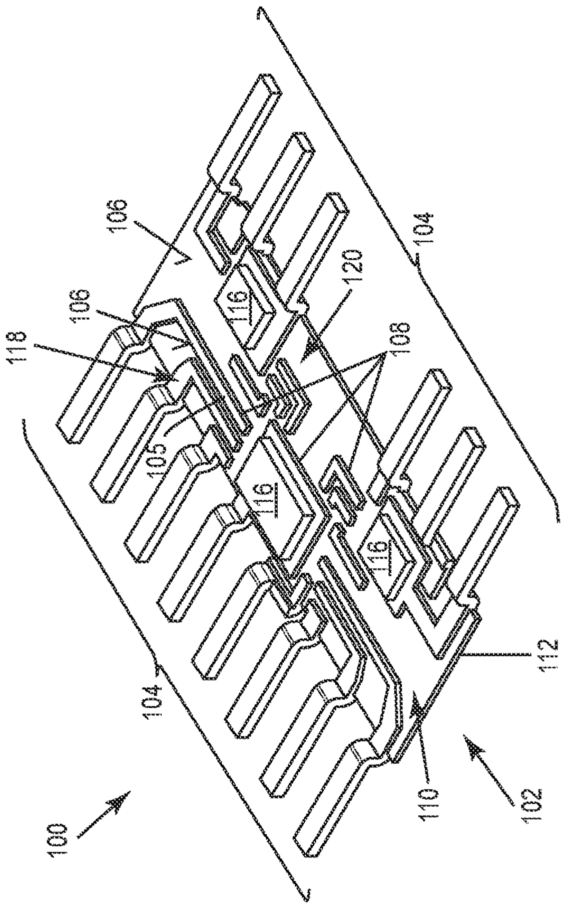

Referring to FIGS. 1A, a method of forming a semiconductor package comprises providing a lead frame 100. The lead frame 100 can be a metal structure, such as a structure comprising copper, aluminum, nickel, and alloys or combinations thereof. The lead frame 100 comprises a central metal plate 102 and a plurality of leads 104 extending away from the central metal plate 102. The central metal plate 102 has an enclosed geometry (e.g., rectangular as shown), and the leads 104 are elongated structures that extend away from the outer edge sides of the central metal plate 102. The leads 104 and/or the central metal plate 102 may be connected to a peripheral structure or structure of the lead frame 100 (not shown) and thus may form part of a lead frame strip with multiple package sides.

An upper surface 106 of the central metal plate 102 is structured to comprise a plurality of mesas 108. The mesas 108 are projections in the upper surface 106 of the central metal plate 102 that are elevated from recessed regions 110 of the central metal plate 102. To this end, the mesas 108 may each comprise outer sidewalls that extend upward from the recessed regions 110 and a substantially planar upper surface that extends between the outer sidewalls. The outer sidewalls of the mesas 108 may form substantially perpendicular angles with the upper surface 106 of the central metal plate 102 in the recessed regions 110 and/or with the upper surfaces of the mesas 108. Alternatively, the outer sidewalls of the mesas 108 may be disposed at oblique angles and/or form gradual transitions with the upper surface 106 of the central metal plate 102 in the recessed regions 110 and/or with the upper surfaces of the mesas 108.

According to an embodiment, the central metal plate 102 comprises a base section 112 with a substantially uniform thickness. That is, a lower part of the central metal plate 102 that is underneath the mesas 108 has a substantially uniform thickness as measured between the upper surface 106 of the central metal plate 102 in the recessed regions 110 and a rear surface 114 (e.g., as seen in FIG. 1E) of the central metal plate 102 that is opposite from the central metal plate 102. Thus, the mesas 108 may correspond to thicker parts of the central metal plate 102 that project upward from the thinner base section 112 part of the central metal plate 102.

According to an embodiment, the structured upper surface 106 of the central metal plate 102 is formed by a half-etching technique. According to this technique, a substantially uniform thickness sheet of metal comprising, e.g., copper, aluminum, nickel, and alloys or combinations thereof, is provided. Subsequently, the uniform thickness sheet of metal is selectively etched in the desired pattern, wherein the etching is performed to about half the depth of the sheet of metal. In that case, the mesas 108 may correspond to the non-etched regions, i.e., the masked regions, and the recessed regions 110 may correspond to the half-etched regions. If desired, mesas 108 of different heights may be obtained through multiple etching steps. Moreover, the structural features of the lead frame 100 including the features of the central metal plate 102 and the leads 104 can be created by performing any one or more metal processing techniques including, e.g., etching, grinding, stamping, coining, etc.

According to an embodiment, the upper surface 106 of the central metal plate 102 is structured such that some of the mesas 108 are configured as die pad mesas. These die pad mesas are dimensioned to accommodate the mounting of one or more semiconductor dies 116 thereon, wherein the mounting surface corresponds to the upper surface 105 of the mesa 108. For example, as shown, the upper surface 106 of the central metal plate 102 is structured such that three of the mesas 108 are configured as die pad mesas, each of which accommodates the mounting of a semiconductor die 116 thereon.

According to an embodiment, the upper surface 106 of the central metal plate 102 is structured such that some of the mesas 108 are configured as conductive tracks. The conductive tracks are used to form at least part of electrical interconnections between the semiconductor dies 116 and the leads 108 and/or between two of the semiconductor dies 116. These electrical interconnections may be complete connections, or may be parts of electrical connections that comprise other interconnect elements, such as clips, wires, ribbons, etc. Some of the mesas 108 may be configured as lead extensions 118 that are elevated from recessed regions 110 of the central metal plate 102. The lead extensions 118 are conductive tracks in the lead frame 100 that form an interconnection between one or more of the semiconductor dies 116 and the leads 104. The lead extensions 118 are routed to the leads 104, meaning that the lead extensions 118 extend to an edge side of the central metal plate 102 and intersect the leads, thus forming a continuous connection thereto. Additionally, the conductive tracks comprise interconnect tracks 120 that are elevated from the recessed regions 110 of the central metal plate 102. The interconnect tracks 120 form electrical interconnections between two or more semiconductor dies 116 and/or between one or more of the semiconductor dies 116 and the leads 104. Different to the lead extensions 118, the interconnect tracks 120 do not directly adjoin with the leads 104 at the edge side of the central metal plate 102, and thus form an internally isolated structure within the boundaries of the central metal plate 102.

After providing the lead frame 100, one or more semiconductor dies 116 may be mounted on the upper surface 106 of central metal plate 102 such that a lower surface of the semiconductor die 116 is at least partially disposed on one of the mesas 108. As shown, a semiconductor die 116 is mounted on each one of the mesas 108 that are configured as die pad mesas. In this case, the lower surface of each semiconductor die 116 is completely disposed on one of the mesas 108, meaning no part of the semiconductor die 116 overhangs past an edge of the mesa 118 to which it is mounted on. Generally speaking, the semiconductor dies 116 can be any type of device, e.g., discrete transistor, logic device, passive device, etc. In one particular example, two of the semiconductor dies 116 are each configured as discrete power transistors, e.g., MOSGETs, IGBTs, etc., and the third semiconductor die is a logic die that is configured to control a switching operation of the other two devices. This arrangement can be used to form an integrated half-bridge circuit, for example. An adhesive such as solder, sinter, glue or tape may be provided between a rear surface of the semiconductor die 116 and the upper surface 106 of the mesa to which the semiconductor die 116 is mounted on. In the case of a vertical device configuration, this adhesive may also form an electrically conductive connection between a rear surface terminal of the semiconductor die 116 and the upper surface 106 of the mesa to which the semiconductor die 116 is mounted on.

Figure 1C:
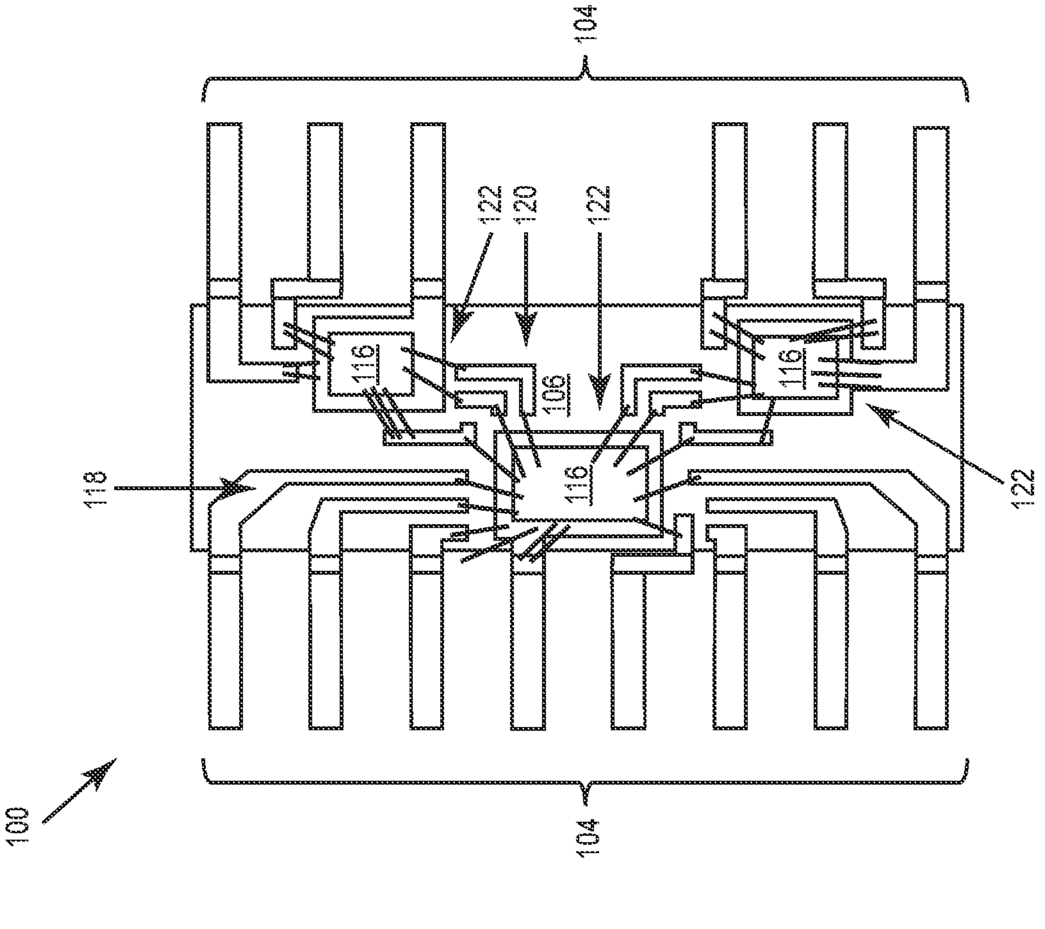
Figure 1E:
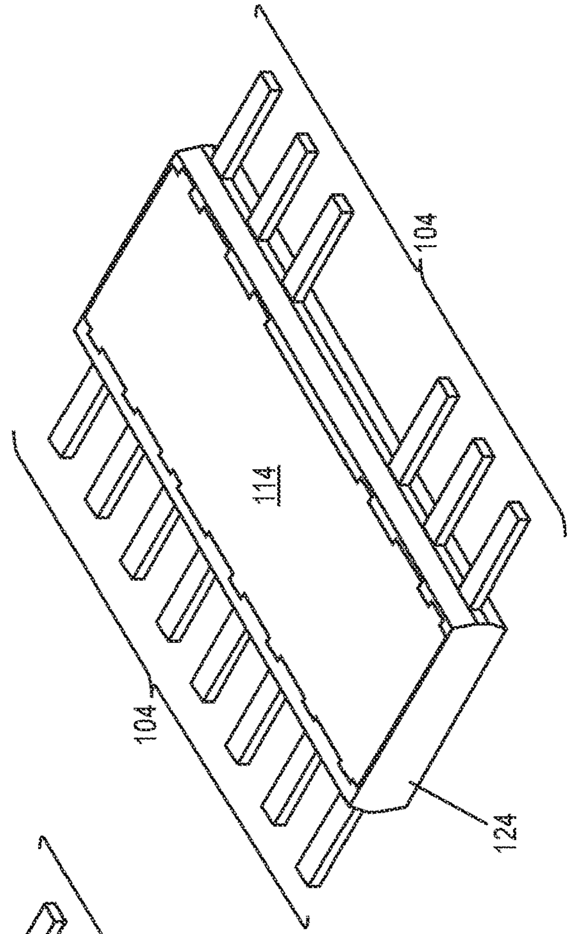

Referring to FIG. 1C, electrical interconnections between the semiconductor dies 116 and the lead frame 100 are formed. As shown, the electrical interconnections are effectuating by providing electrical interconnect elements 122 that are connected between upper surface terminals of the semiconductor dies 116 and the mesas 108 that are configured as conductive tracks, i.e., the lead extensions 118 and the interconnect tracks 120. As shown, the electrical interconnect elements 122 are configured as bond wires. More generally, the electrical interconnect elements 122 can be any type conductive interconnect structure, e.g., metal clip, ribbon, etc. Moreover, the electrical interconnect elements 122 can have different numbers, sizes, material composition, etc., to meet design requirements such as current carrying capacity.

Figure 1D:
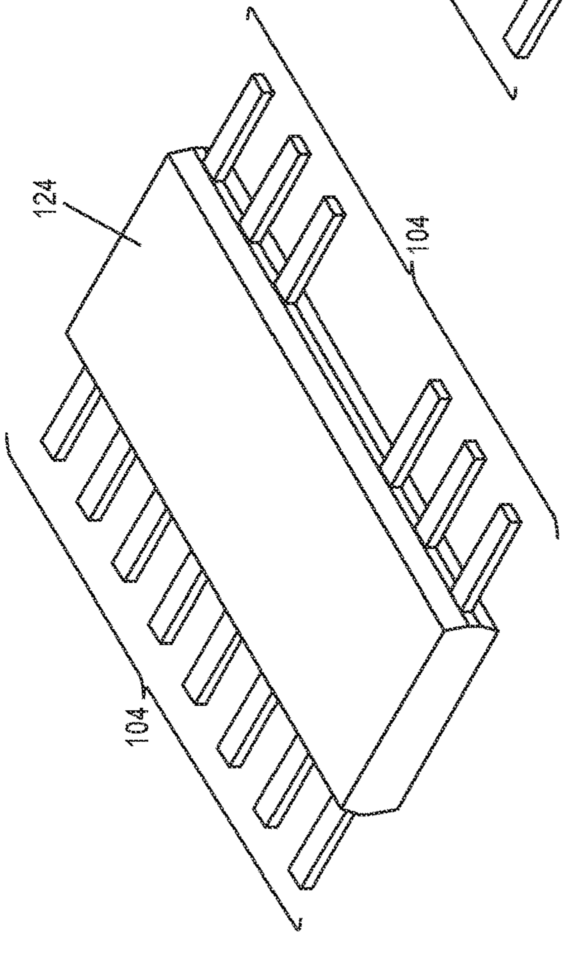

Referring to FIGS. 1D-1E, an encapsulant body 124 is formed on the lead frame 100. FIG. 1D illustrates an upper surface of the formed package and FIG. 1E illustrates a rear surface of the semiconductor package. Generally speaking, the encapsulant body 124 can include a wide variety of electrically insulating materials that are suitable for semiconductor packaging. Examples of these materials include mold compound, epoxy, thermosetting plastic, polymer, resin, fiber and glass woven fiber materials, etc. The encapsulant body 124 can be formed by a molding process such as injection molding, transfer molding, compression molding, etc. The encapsulant body 124 is formed such that each of the leads 104 protrude out from outer edge sides of the encapsulant body 124. Thus, a so-called leaded package is realized. Generally speaking, the concepts described herein are applicable to variety of leaded package types, e.g., surface mount packages, quad leaded packages, etc.

As can be seen in FIG. 1E, the encapsulant body 124 is formed such that a rear surface 114 of the central metal plate 102 that is opposite from the upper surface 106 of the central metal plate 102 is exposed from the encapsulant material at a rear side of the semiconductor package. This may be realized through geometric configuration of the mold tool cavity used to form the encapsulant body 124, or by removing encapsulant material by grinding, etching, etc., after forming the encapsulant body 124.

Figure 1G:
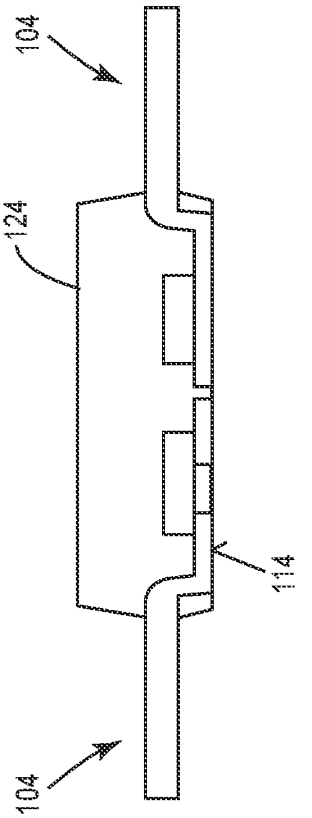
Figure 1F:
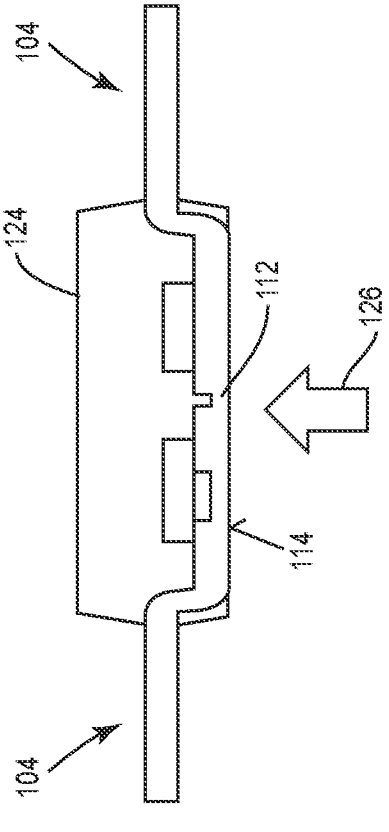

Referring to FIGS. 1F-1G, rear side processing 126 is performed at a rear side of the semiconductor package that comprises a lower surface of the encapsulant body 124 and the exposed rear surface 114 of the central metal plate 102. The rear side processing 126 thins the central metal plate 102 until the base section 112 of the central metal plate 102 is completely removed. Generally speaking, the rear side processing 126 can comprise any one or more processing steps that remove material from the central metal plate 102. Examples of these techniques include any one or combination of: chemical etching, mechanical grinding, milling, or lasering. According to an embodiment, the rear side processing 126 comprises planarizing the rear side of the semiconductor package so as to remove material from the encapsulant body 124 and the base section 112 simultaneously, wherein after the planarizing the lower surface of the encapsulant body 124 is coplanar with exposed rear surfaces of the mesas 108 that are isolated from one another. For example, a mechanical planarization technique may be used to simultaneously remove encapsulant material and metal from the lead frame 100. Alternatively, in the case of other types of thinning techniques such as etching or lasering, the central metal plate 102 can be thinned to that rear surfaces of the mesas 108 are isolated from one another and recessed from the surrounding encapsulant material.

Figure 1H:
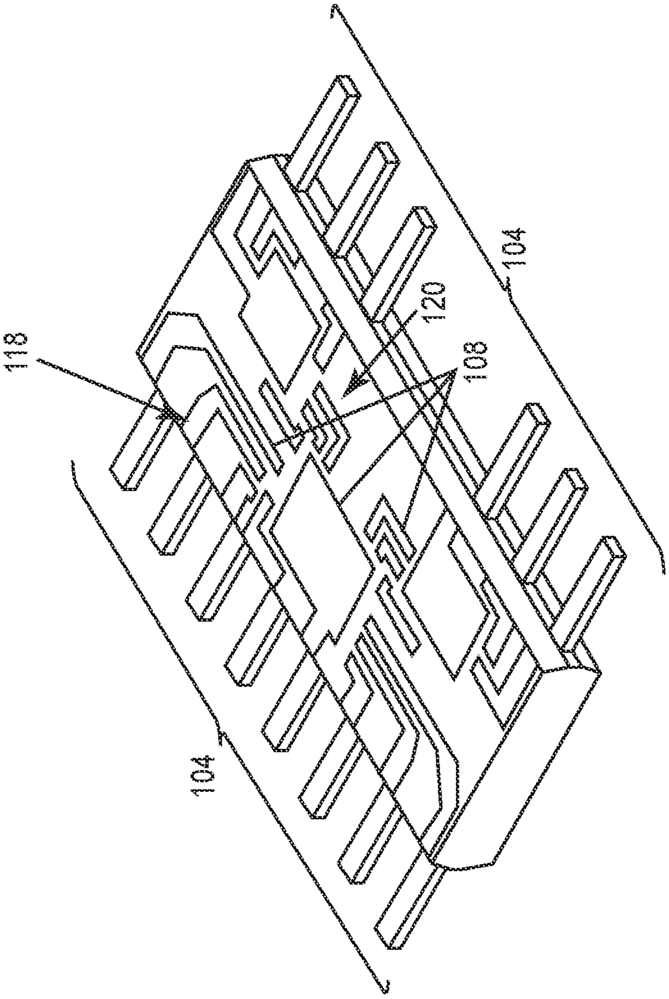

Referring to FIG. 1H, the rear side of the semiconductor package is shown after the thinning of the base section 112 is completed. As can be seen, the thinning process completely removes the base section 112 so that only the mesas 108 remain. As a result, each of the mesas 108 of the central metal plate 102 are isolated from one another at the lower surface of the encapsulant body 124. That is, the mesas 108 are electrically isolated from one another by encapsulant material. Thus, each of the mesas 108 that are configured as die pad mesas are transformed into electrically isolated die pad structures that accommodate the semiconductor dies 116 thereon. Each of the mesas 108 that are configured as lead extensions 118 are transformed into electrically isolated connection paths that complete an electrical connection between the terminals of the semiconductor dies 116 and distinct ones the leads 104. Each of the mesas 108 that are configured as interconnect tracks 120 are transformed into electrically isolated connection paths that provide an interconnection within the encapsulant body 124.

Figure 1J:
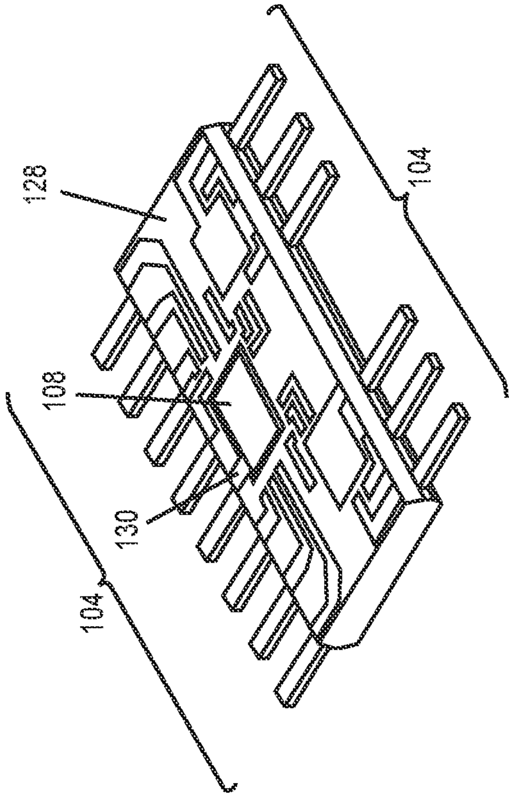
Figure 1K:
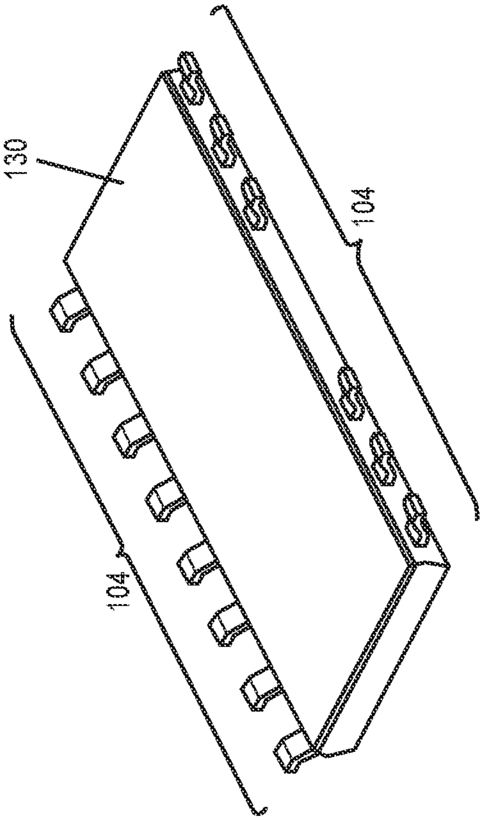
Figure 1I:
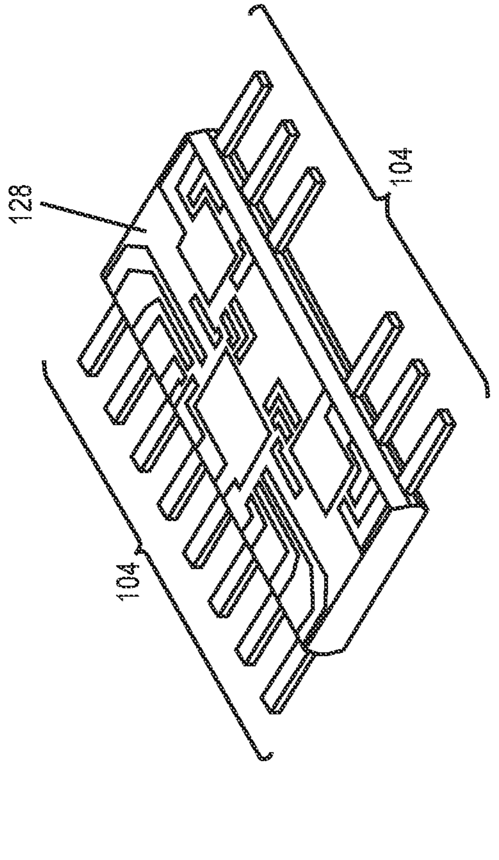

Referring to FIG. 1I, after thinning the central metal plate 102 as described above, a layer of electrically insulating material 128 may be provided at the rear side of the semiconductor package. The layer of electrically insulating material 128 may be used to protect and electrically isolate the exposed metal surfaces of the mesas 108. For example, the layer of electrically insulating material 128 may be used to cover the rear surfaces of the mesas 108 that are configured as lead extensions 118 and the mesas 108 that are configured as interconnect tracks 120 so as to prevent unwanted electrical contact to these structures. Generally speaking, the layer of electrically insulating material 128 can comprise any electrically insulating material suitable for semiconductor packaging applications. According to one particular embodiment, the layer of electrically insulating material 128 comprises a solder resist material such as a lacquer, epoxy, liquid photoimageable solder mask, dry-film photoimageable solder mask, etc.

As shown in FIG. 1J, the layer of electrically insulating material 128 may be formed to comprise at least one opening 130 that exposes at least one of the mesas 108 at the rear surface of the semiconductor package. For example, one of the mesas 108 that is configured as a die pad may be exposed by the opening 130 so as to enable a power connection, e.g., a source connection, at the rear surface of the semiconductor package.

Referring to FIG. 1K, a second layer of electrically insulating material 130 may be provided at the rear side of the semiconductor package. The second layer of electrically insulating material 130 can be provided over the layer of electrically insulating material 128, e.g., as described with reference to FIGS. 1F-G, or can be provided in substitution of this layer so as to be disposed directly on the rear side of the semiconductor package and the exposed mesas 108. The second layer of electrically insulating material 130 may be an advanced electrical isolation material with high thermal conductivity in combination with low electrical conductivity. For example, the second layer of electrically insulating material 128 may comprise a TIM (thermal interface material) or thermal grease. This allows for the semiconductor package to be mounted on an external cooling apparatus, such as a heat sink, with efficient thermal coupling and electrical isolation between the semiconductor package and the cooling apparatus.

Figure 2B:
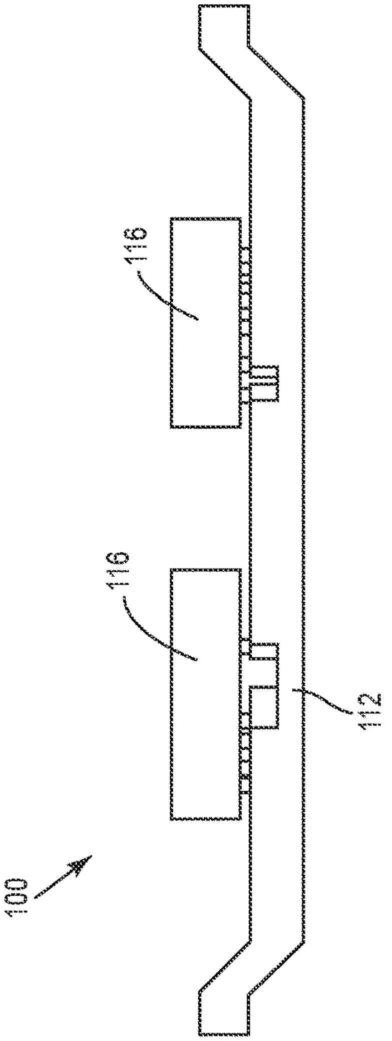
FIGS. 2A-2F, illustrates selected method steps from a method of forming a semiconductor package, according to an embodiment.
Figure 2A:
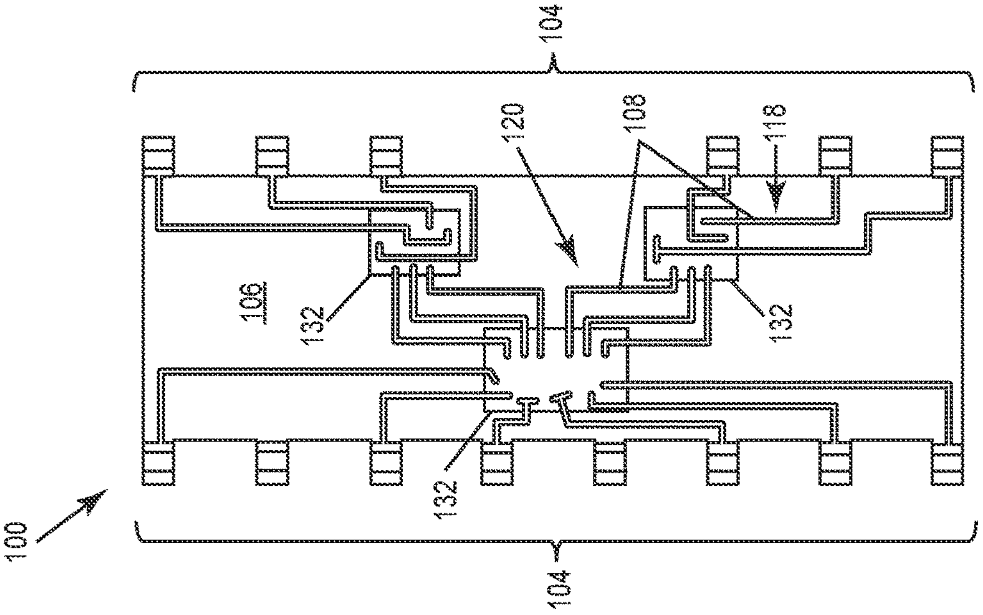

Referring to FIGS. 2A and 2B, a method of forming the semiconductor package is shown, according to another embodiment. In this case, upper surface 106 of the central metal plate 102 is structured to comprise the mesas 108 that are configured as conductive tracks, i.e., the lead extensions 118 or the interconnect tracks 120, and these conductive tracks are routed to die attach regions 132. In the die attach regions 132, interior ends of the mesas 108 that are configured as lead extensions 118 or the interconnect tracks 120 terminate and provide a direct mounting point for a semiconductor die 116. In a difference to the embodiment of FIG. 1, some or all of the mesas 108 that are configured as die pad mesas may be omitted, as the die attach regions 132 can replace the need for a die pad mesa.

After providing the lead frame 100, the semiconductor dies 116 are flip-chip mounted on the semiconductor package. Flip-chip mounting refers to a technique whereby a main surface of the semiconductor die 116 comprising terminals of the semiconductor die is mounted to directly face the chip carrier, and electrical connections to the terminals are effectuated using a conductive intermediary, such as a solder balls. Thus, a plurality of solder balls, stud bumps, etc., may be provided on the conductive tracks at the appropriate location and the semiconductor die 116 may be mounted and secured to the lead frame 100 by these features. The semiconductor dies 116 may be mounted on the mesas 108 that form the lead extensions 118, or the mesas 108 that form the interconnect tracks 120, or both. In a difference to the embodiment of FIG. 1, each semiconductor die 116 is mounted on multiple ones of the mesas 108, and is only partially disposed on each mesa, meaning that each semiconductor die 116 laterally extends outside of the mesa 108. Moreover, electrical interconnect elements 122 such as bond wires may be omitted.

Figure 2D:
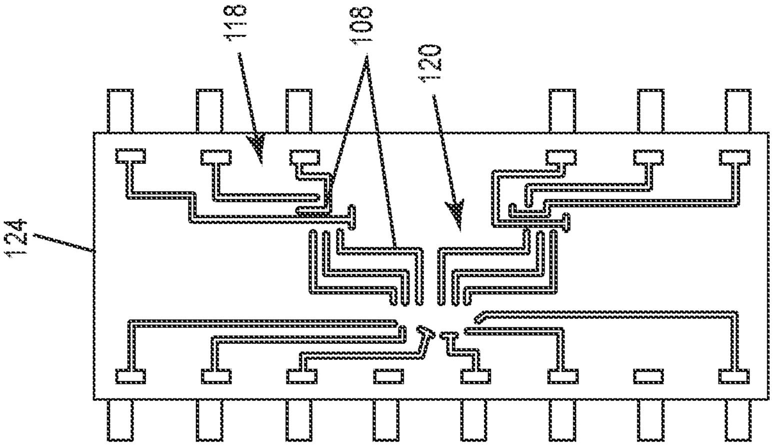
Figure 2C:
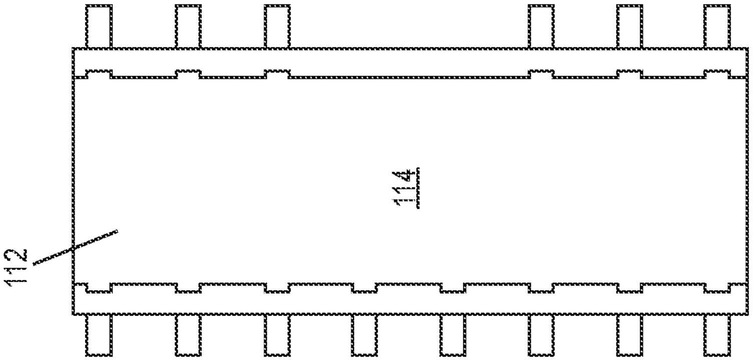

Referring to FIGS. 2C-2D, the rear surface of the semiconductor package is shown. FIG. 2C illustrates the rear surface of the semiconductor package before performing the rear side processing 126 to remove the base section 112 of the central metal plate 102 and FIG. 2D illustrates the rear surface of the semiconductor package after performing the rear side processing 126 to remove the base section 112 of the central metal plate 102. As can be seen in Fic 2C, in this embodiment, the encapsulant body 124 is formed such that the encapsulant material surrounds the outer edge sides of the central metal plate 102. This may be obtained by a molding process wherein a separate molding chamber is used to form the encapsulant body 124 for each semiconductor package, i.e., only one of the central metal plates 102 is arranged in a mold cavity.

As can be seen in FIG. 2D, after the base section 112 of the central metal plate 102 is removed, each of the mesas 108 which form the lead extensions 118 and the interconnect tracks 120 are electrically isolated from one another by the encapsulant material of the encapsulant body 124. After performing this step, the exposed mesas 108 can be covered by a layer of electrically insulating material 128, e.g., a solder resist and/or thermal interface material, in a similar manner as previously described.

Figure 2F:
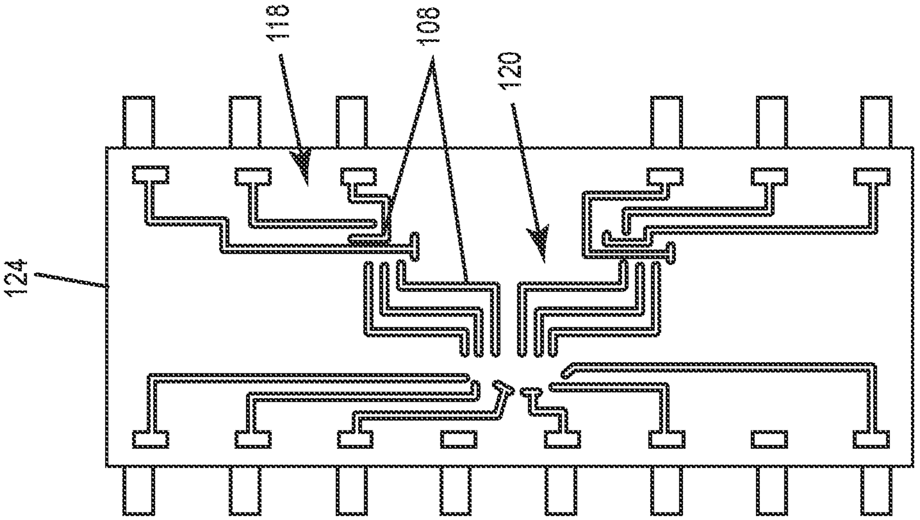
Figure 2E:
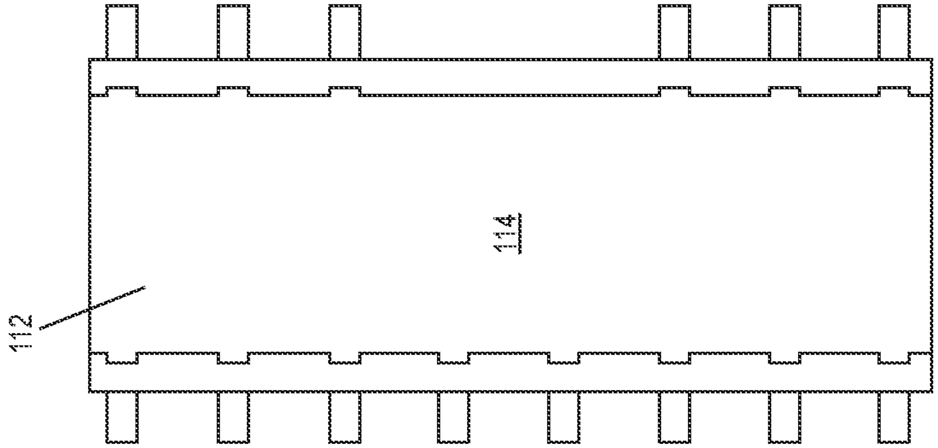

Referring to FIGS. 2E-2F, an alternative technique for forming the semiconductor package is depicted. As shown in FIG. 2E, the semiconductor package is formed such that the two edge sides of the base section 112 of the central meal plate 102 extend to the edge sides of the encapsulant body 124. In a difference to the embodiment shown in FIGS. 2C-2D, in this embodiment the lead frame 100 is provided from a lead frame strip that is used to form a plurality of the semiconductor packages, and the central metal plate 102 is part of a continuous structure that is used to form each of the semiconductor packages. The continuous structure is patterned into a plurality of package sites, wherein each package site comprises the structured upper surface 106 with the mesas 108 as previously described. The encapsulant body 124 can be formed by a molding process that forms the encapsulant material on the continuous structure, thus forming the encapsulant body 124 for multiple package sites using one mold cavity. After the molding process, the continuous structure can be diced, e.g., by sawing, lasering, etc. encapsulant to singulate the semiconductor package into the depicted device. Subsequently, the rear side processing 126 is performed to remove the base section 112 of the central metal plate 102, thus producing the arrangement shown in FIG. 2F. The technique described with reference to FIGS. 2E-2F allows for batch processing, which can lead to potential cost savings and/or throughput improvements.

Figure 3A:
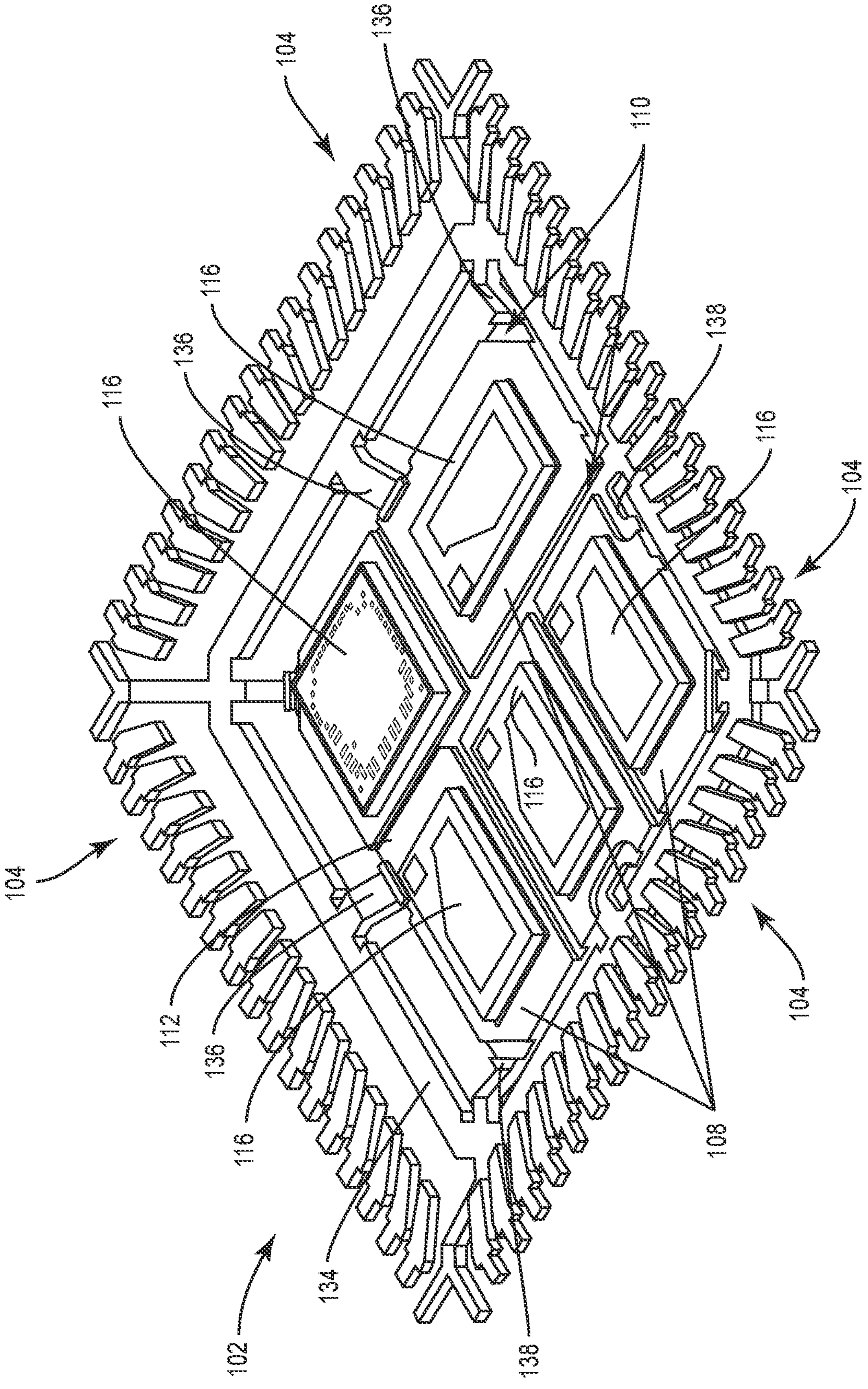
FIGS. 3A-3E, illustrates selected method steps from a method of forming a semiconductor package, according to an embodiment.

Referring to FIG. 3A, a method of forming the semiconductor package is shown, according to another embodiment. In this case, the lead frame 100 comprises a peripheral structure 134 that surrounds the central metal plate 102. The peripheral structure 134 is connected to the central metal plate 102 by one or more tie bars 136. In this way, the peripheral structure 134 and the tie bars 136 mechanically support the plate 102 during placement of the semiconductor dies 116 and provision of the electrical interconnect elements 122. The peripheral structure 134 and the leads 104 may each be connected with an outer peripheral structure (not shown) which mechanically supports these features during assembly and allows for handling of the assembly between the various processing tools. The peripheral structure 134 is arranged between the central metal plate 102 and interior ends of the leads 104 which face the central metal plate 102. The peripheral structure 134 may comprise multiple parts and/or interruptions instead of the continuous enclosed structure as shown. Separately or in combination, the number of tie bars 136 and connection points between the peripheral structure 134 and the tie bars 136 can be adapted to a particular lead frame 100 configuration for design considerations such as structural stability.

The upper surface 106 of the central metal plate 102 is structured to comprise a plurality of tie bar attachment mesas 138. The tie bar attachment mesas 138 refer to the mesas 108 in the upper surface 106 of the central metal plate 102 that are disposed at the outer edge of the central metal plate 102 and are connected to the tie bars 136. The tie bar attachment mesas 138 can be created by the same process which forms the mesas 108 that are configured as die pads or conductive tracks, as previously described. However, the tie bar attachment mesas 138 are not electrically connected to any terminal of the semiconductor die 116, and instead serve as physical support structures for temporarily supporting the central metal plate 102.

As shown in FIG. 3A, the central metal plate 102 is structured to comprise a plurality of the mesas 108 that are each configured as die pad mesas, each of which comprises a semiconductor die 116 mounted thereon. According to an embodiment, one of the semiconductor dies 116 is configured as a logic die, and the four remaining semiconductor dies 116 are configured as vertical power transistors, e.g., MOSFETs, IGBTs, etc. In this case, the vertical power transistor dies can be arranged as power converter circuits, e.g., half-bridge circuit or full-bridge circuit, and the logic die can be a driver die that is configured to control the switching operation of each transistor die.

Figure 3B:
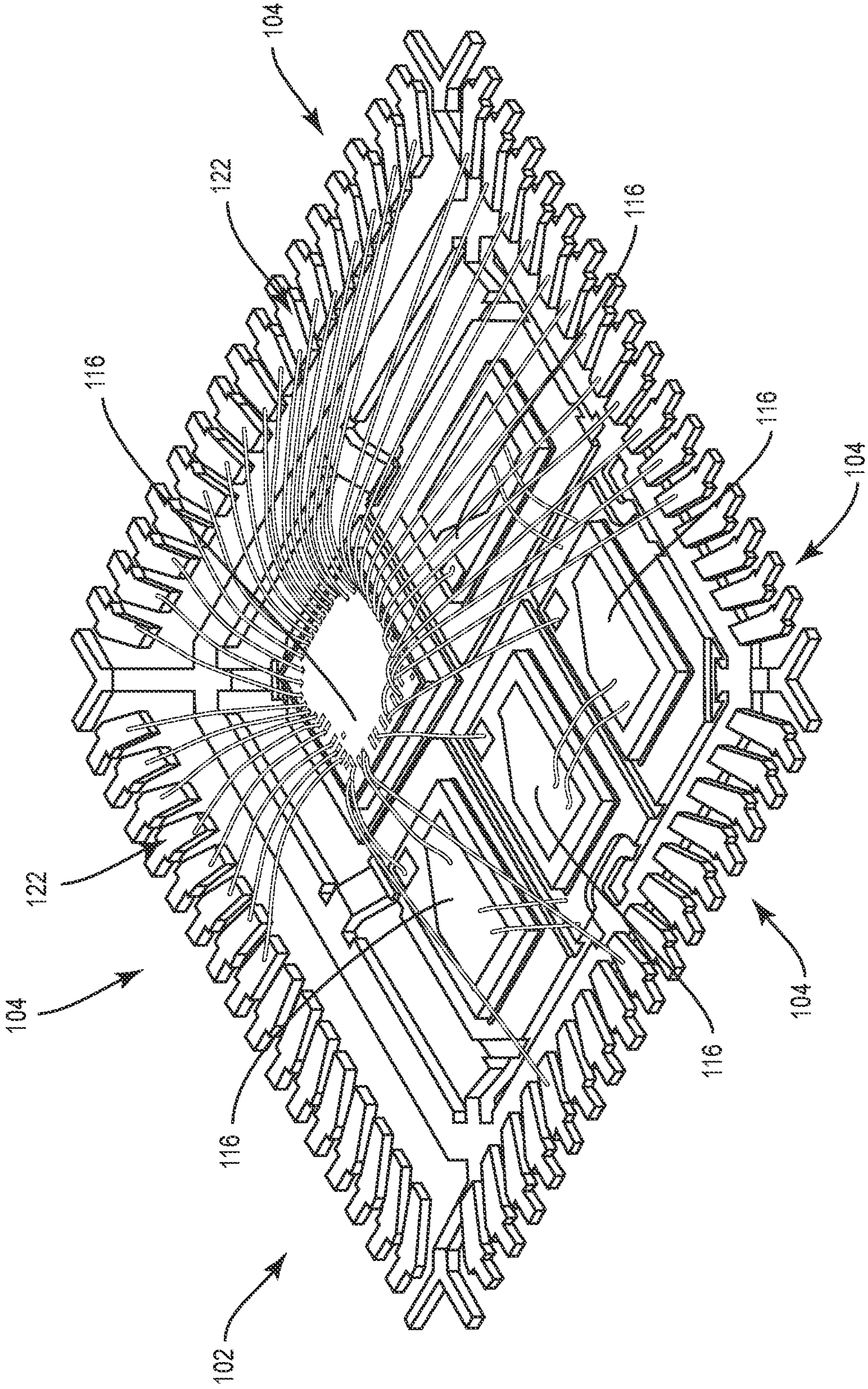

Referring to FIG. 3B, the electrical interconnect elements 122 (in this case bond wires) are formed between the terminals of the semiconductor dies 116 and interior ends of the leads 104 before forming the encapsulant body 124. In a difference to the embodiments described with reference to FIG. 1-2, in this case the mesas 108 that are configured conductive tracks may be omitted, as the electrical interconnect elements 122 provide direct electrical connections to the leads 104. Alternatively, the mesas 108 that are configured as conductive tracks as described with reference to FIG. 1-2, i.e., the lead extensions 118 or the interconnect tracks 120 may be incorporated into the semiconductor package.

Figure 3D:
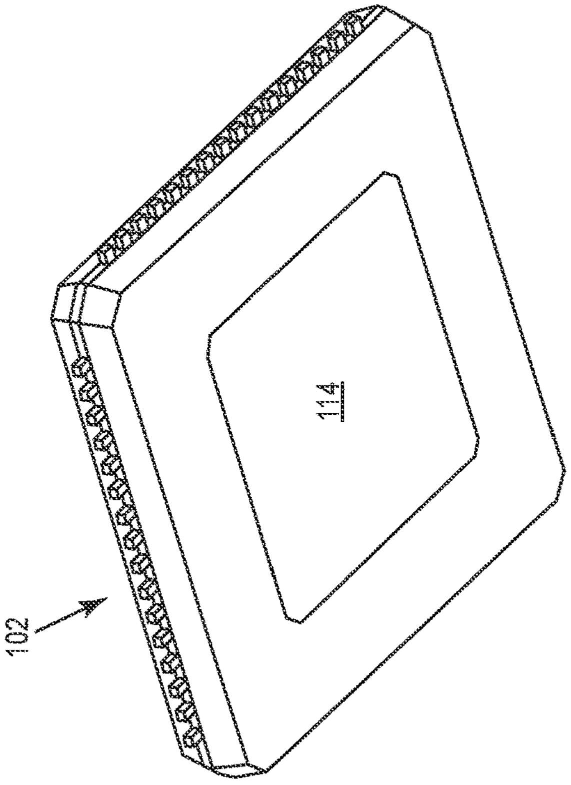
Figure 3C:
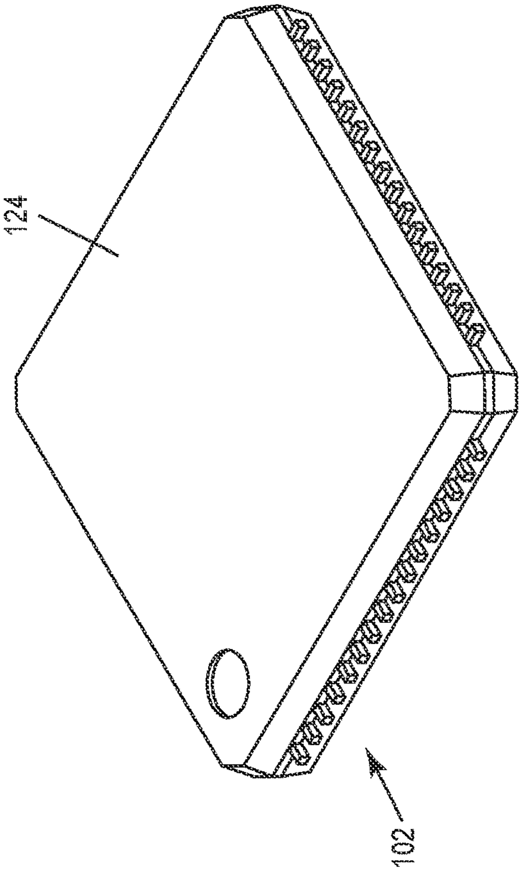

Referring to FIGS. 3C-3D, the encapsulant body 124 is formed on the central metal plate 102 so to encapsulate each of the semiconductor dies 116 and associated electrical connections. After encapsulation is complete and the encapsulant material hardens, a lead trimming process may be performed so as to detach each of the leads 104 from the outer peripheral structure.

Figure 3E:
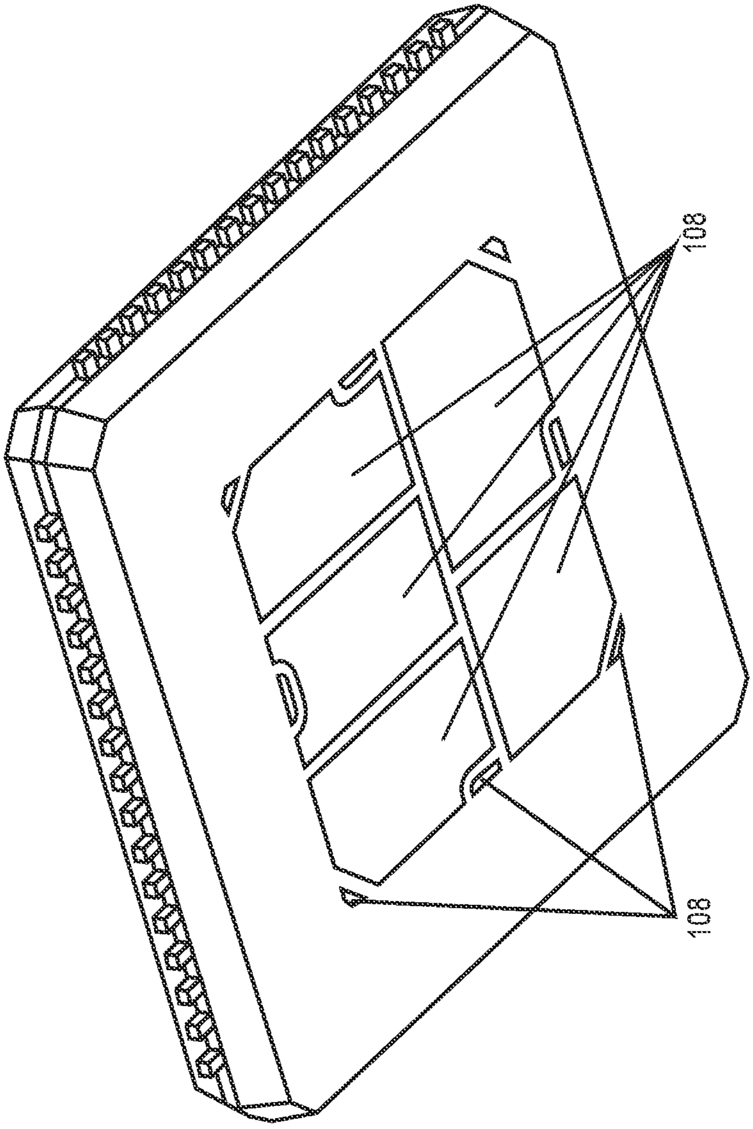

Referring to FIGS. 3E, the rear surface of the semiconductor package is shown after performing the rear side processing 126 so as to thin the central metal plate 102 until the base section 112 of the central metal plate 102 is completely removed. As can be seen, the thinning process removes the base section 112 such that each of the mesas 108 that are configured as die pad mesas are isolated from one another in a similar manner as previously described. Moreover, the thinning of central metal plate 102 from the rear surface detaches each of the tie bar attachment mesas 138 from the adjacent ones of the mesas 108. In this way, the peripheral structure 134, which may remain present within the encapsulant body 124, is disconnected from each of the semiconductor dies 116. The tie bar attachment mesas 138, the tie bars 136, and the peripheral structure 134 thus form an electrically inactive residual feature of the package. In another embodiment, the peripheral structure 134 may be used as an electrical interconnect structure to form part of an electrical connection between two or more of the semiconductor dies 116. In that case, before forming the encapsulant body 124, the electrical interconnect elements 122 can be connected between the and the terminals of the semiconductor dies 116 and the peripheral structure in a similar manner as previously described. In that case, the separation of the attachment mesas 138 can be used to disconnect only those terminals to which electrical connection with the peripheral structure 136 is not desired.

The semiconductor package described herein may comprise one or more semiconductor dies 116 with a variety of different configurations. These semiconductor dies 116 may be singulated from a semiconductor wafer (not shown), e.g. by sawing, prior to being mounting on lead frame 100. In general, the semiconductor wafer and therefore the resulting semiconductor die 116 may be made of any semiconductor material suitable for manufacturing a semiconductor device. Examples of such materials include, but are not limited to, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), etc.

In general, the semiconductor dies 116 provided in the semiconductor package described herein can be configured as any active or passive electronic component. Examples of these devices include power semiconductor devices, such as power MISFETs (Metal Insulator Semiconductor Field Effect Transistors) power MOSFETs (Metal Oxide Semiconductor Field Effect Transistors), IGBTs (Insulated Gate Bipolar Transistors), JFETs (Junction Gate Field Effect Transistors), HEMTs (High Electron Mobility Transistors), power bipolar transistors or power diodes such as, e.g., PIN diodes or Schottky diodes, etc. Other examples of these devices include logic devices, such as microcontrollers, e.g., memory circuits, level shifters, etc. One or more of the semiconductor dies 116 can be configured as a so-called lateral device. In this configuration, the terminals of the semiconductor die 116 are provided on a single main surface and the semiconductor die 116 is configured to conduct in a direction that is parallel to the main surface of the semiconductor die 116. Alternatively, one or more of the semiconductor dies 116 can be configured as a so-called vertical device. In this configuration, the terminals of the semiconductor die 116 are provided on opposite facing main and rear surfaces and the semiconductor die 116 is configured to conduct in a direction that is perpendicular to the main surface of the semiconductor die 116.

The term "electrically connected" as used herein describes a permanent low-ohmic, i.e., low-resistance, connection between electrically connected elements, for example a wire connection between the concerned elements. By contrast, the term "electrically coupled" contemplates a connection in which there is not necessarily a low-resistance connection and/or not necessarily a permanent connection between the coupled elements. For instance, active elements, such as transistors, as well as passive elements, such as inductors, capacitors, diodes, resistors, etc., may electrically couple two elements together.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of forming a semiconductor package, the method comprising:

providing a lead frame with a central metal plate and a plurality of leads extending away from outer edge sides of the central metal plate, the central metal plate comprising an upper surface that is structured to comprise a first mesa that is elevated from recessed regions of the central metal plate;

mounting a semiconductor die on the upper surface of central metal plate such that a lower surface of the semiconductor die is at least partially disposed on the first mesa;

forming electrical interconnections between terminals of the semiconductor die and the leads;

forming an encapsulant body of electrically insulating mold compound on the central metal plate such that the semiconductor die is encapsulated by the encapsulant body and such that the leads protrude out from edge sides of the encapsulant body; and thinning the central metal plate from a rear surface of the central metal plate so as to isolate the first mesa from another part of the lead frame, wherein before the thinning the rear surface of the central metal plate forms a lowermost surface of the lead frame that extends along a single plane, and wherein thinning the central metal plate comprises removing material along the rear surface so as to decrease the thickness of the central metal plate.

2. The method of claim 1, wherein the central metal plate comprises a base section of substantially uniform thickness, wherein the first mesa projects upwards from the base section, and wherein thinning the central metal plate comprises removing the base section.

3. The method of claim 2, wherein a rear surface of the base section is exposed at the lower surface of the encapsulant body before or during the thinning of the central metal plate, and wherein removing the base section comprises processing a rear side of the semiconductor package comprising the lower surface of the encapsulant body and the central metal plate until the base section is completely removed.

4. The method of claim 3, wherein processing the rear side of the semiconductor package comprises planarizing the rear side of the semiconductor so as to remove material from the encapsulant body and the base section simultaneously, and wherein after the planarizing the lower surface of the encapsulant body is coplanar with an exposed rear surface of the first mesa.

5. The method of claim 3, wherein processing the rear side of the semiconductor package comprises etching at the exposed rear surface of the base section until the base section is removed.

6. The method of claim 2, wherein the upper surface of the central metal plate is structured to comprise a second mesa that is elevated from recessed regions of the central metal plate and laterally spaced apart from the first mesa, and wherein thinning the central metal plate isolates the first and second mesas from one another at the lower surface of the encapsulant body.

7. The method of claim 6, wherein the first mesa is configured as a die pad, and wherein the semiconductor die mounted on the first mesa such that the lower surface of the semiconductor die is at completely disposed on the first mesa.

8. The method of claim 7, wherein the second mesa is configured as a die pad, wherein the method further comprises mounting a second semiconductor die on the upper surface of central metal plate such that a lower surface of the second semiconductor die is at least partially disposed on the second mesa.

9. The method of claim 7, wherein the second mesa is configured as a conductive track, and wherein forming the electrical interconnections between terminals of the semiconductor die and the lead frame comprises electrically connecting one of the terminals of the semiconductor die to the second mesa by an electrical interconnect element.

10. The method of claim 1, wherein thinning the central metal plate comprises any one of: mechanical grinding, milling, or lasering.

11. A method of forming a semiconductor package, the method comprising:

providing a lead frame that comprises a central metal plate and a plurality of leads that extend away from outer edge sides of the metal plate, the central metal plate comprising an upper surface that is structured to comprise a plurality of lead extensions that are elevated from recessed regions of the central metal plate and are routed to the leads;

mounting a semiconductor die on the upper surface of the central metal plate;

electrically connecting terminals of the semiconductor die to the lead extensions;

forming an encapsulant body of electrically insulating mold compound on the central metal plate that encapsulates the semiconductor die and exposes outer ends of the leads; and thinning the central metal plate from a rear surface of the central metal plate that is opposite from the upper surface so as to isolate the lead extensions from one another at a lower surface of the encapsulant body, wherein the leads laterally protrude out from sidewalls of the encapsulant body.

12. The method of claim 11, further comprising:

after thinning the central metal plate, providing a layer of electrically insulating material at the lower surface of the encapsulant body that covers the lead extensions.

13. The method of claim 11, wherein the semiconductor die is mounted on the plurality of lead extensions, and wherein electrically connecting terminals of the semiconductor die comprises flip-chip mounting the semiconductor die such that the terminals of the semiconductor die face and electrically connect with the lead extensions.

14. The method of claim 11, wherein the central metal plate is structured to comprise a first mesa that is elevated from the recessed regions of the central metal plate, wherein the semiconductor die is mounted on the first mesa, and wherein electrically connecting the terminals of the semiconductor die to the lead extensions comprises providing electrical interconnect elements between the terminals of the semiconductor die and the lead extensions.

15. The method of claim 11, wherein the lead frame is provided from a lead frame strip that is used to form a plurality of the semiconductor packages, wherein the central metal plate is part of a continuous structure that is used to form each of the semiconductor packages, wherein forming the encapsulant body comprises a molding process that forms the encapsulant material on the continuous structure, and wherein the method further comprises dicing the continuous structure with the encapsulant to singulate the semiconductor package.

16. The method of claim 11, wherein forming the encapsulant body comprises a molding process that forms the encapsulant material on the central metal plate such that encapsulant material of the encapsulant body surrounds the central metal plate.

17. The method of claim 11, wherein the upper surface that is structured to comprise an interconnect track that is elevated from the recessed regions of the central metal plate, wherein the method further comprises:

mounting a second semiconductor die on the upper surface of the central metal plate;

electrically connecting one of the terminals of the semiconductor die to the interconnect track; and electrically connecting a terminal of the second semiconductor die to the interconnect track.

18. The method of claim 17, wherein the central metal plate is structured to comprise first and second mesas that are each elevated from the recessed regions of the central metal plate, wherein the semiconductor die is mounted on the first mesa, wherein the second semiconductor die is mounted on the second mesa, wherein electrically connecting one of the terminals of the semiconductor die to the interconnect track comprises providing a first electrical interconnect element between the one of the terminals of the semiconductor die and the interconnect track, and wherein electrically connecting the terminal of the second semiconductor die to the interconnect track comprises providing a second electrical interconnect element between the terminal of the second semiconductor die and the interconnect track.

* * * * *